US006563589B1

(12) United States Patent
Bennett et al.

(10) Patent No.: US 6,563,589 B1
(45) Date of Patent: *May 13, 2003

(54) REDUCED MINIMUM CONFIGURATION FIBER OPTIC CURRENT SENSOR

(75) Inventors: Sidney M. Bennett, Chicago, IL (US); Richard B. Dyott, Oak Lawn, IL (US)

(73) Assignee: KVH Industries, Inc., Middletown, RI (US)

( * ) Notice: Subject to any disclaimer, the term of this patent is extended or adjusted under 35 U.S.C. 154(b) by 91 days.

This patent is subject to a terminal disclaimer.

(21) Appl. No.: 09/615,166

(22) Filed: Jul. 13, 2000

Related U.S. Application Data

(63) Continuation-in-part of application No. 08/835,307, filed on Apr. 7, 1997, now abandoned.
(60) Provisional application No. 60/015,884, filed on Apr. 19, 1996, and provisional application No. 60/143,847, filed on Jul. 15, 1999.

(51) Int. Cl.$^7$ ................................................. G01B 9/02
(52) U.S. Cl. ..................................................... 356/483
(58) Field of Search ............................... 356/483, 460, 356/464; 250/227.19, 227.27; 385/12

(56) References Cited

U.S. PATENT DOCUMENTS 4,571,650 A    2/1986    Ojima et al.

(List continued on next page.)

FOREIGN PATENT DOCUMENTS

| DE | 33 05 104 A1 | 8/1984 |
| DE | 36 15 305 A1 | 11/1987 |
| DE | 37 42 201 A1 | 6/1989 |
| EP | 0 551 874 A2 | 7/1993 |
| EP | 0 586 242 A1 | 9/1994 |
| EP | 0 686 867 A1 | 12/1995 |
| EP | 0 722 081 A2 | 7/1996 |
| EP | 856 737 A1 | 8/1998 |
| EP | 0 871 009 A1 | 10/1998 |
| EP | 0 872 756 A1 | 10/1998 |
| JP | 07209398 | 8/1995 |
| WO | WO98/58268 A | 12/1998 |
| WO | WO00/36425 | 6/2000 |

OTHER PUBLICATIONS

US 6,208,775, 3/2001, Dyott (withdrawn).
In–Line Sagnac Interferometer Current Sensor, Blake et al, IEEE, 1995.*
Optical Fibre Sensors, Bohnert et al, SPIE–vol.–2360, Oct. 1994, pp 16–19.*

(List continued on next page.)

Primary Examiner—Samuel A. Turner
(74) Attorney, Agent, or Firm—Foley Hoag, LLP

(57) ABSTRACT

A reduced minimum configuration (RMC) fiber optic current sensor (FOCS) is proposed which includes a sensing coil or sensing region, a light source and an optical path arranged between the front output of the light source and the fiber optic sensing coil/region. At least one quarter wave plate is disposed between the optical path and the sensing coil/region for converting linearly polarized light beams into circularly polarized light beams propagating through the sensing coil/region. The circularly polarized light beams propagating though the sensing region experience a differential phase shift caused by a magnetic field or current flowing in a conductor proximate to the sensing coil. A light detector is located at the back output of the light source and produces an output signal in response to return light intensity transmitted through the light source. The return light intensity is a measure of the magnetic field in the sensor coil/region. The magnetic field may be produced by an electric current flowing through a wire, wherein the sensor coil can be wound around the wire. Electronics is described which minimizes effects caused by changes in the environmental conditions.

16 Claims, 4 Drawing Sheets

U.S. PATENT DOCUMENTS

| | | |
|---|---|---|
| 4,630,229 A | 12/1986 | D'Hondt |
| 4,630,890 A | 12/1986 | Ashkin et al. |
| 4,637,722 A | 1/1987 | Kim |
| 4,668,264 A | 5/1987 | Dyott |
| 4,669,814 A | 6/1987 | Dyott |
| 4,697,876 A | 10/1987 | Dyott |
| 4,712,866 A | 12/1987 | Dyott |
| 4,740,085 A | 4/1988 | Lim |
| 4,755,021 A | 7/1988 | Dyott |
| 4,756,589 A | 7/1988 | Bricheno et al. |
| 4,765,739 A | 8/1988 | Koizumi et al. |
| 4,776,700 A | 10/1988 | Frigo |
| 4,796,993 A | 1/1989 | Sonobe et al. |
| 4,815,817 A | 3/1989 | Levinson |
| 4,842,409 A | 6/1989 | Arditty et al. |
| 4,848,910 A | 7/1989 | Dupraz |
| 4,883,358 A | 11/1989 | Okada |
| 4,887,900 A | 12/1989 | Hall |
| 4,943,132 A | 7/1990 | Huang |
| 5,033,854 A | 7/1991 | Matthews et al. |
| 5,048,962 A | 9/1991 | Kurokawa et al. |
| 5,074,665 A | 12/1991 | Huang et al. |
| 5,080,489 A | 1/1992 | Nishikawa et al. |
| 5,106,193 A * | 4/1992 | Fesler et al. ................. 356/460 |
| 5,133,600 A | 7/1992 | Schröder |
| 5,135,555 A | 8/1992 | Coyle, Jr. et al. |
| 5,289,257 A | 2/1994 | Kurokawa et al. |
| 5,289,258 A | 2/1994 | Szafraniec et al. |
| 5,331,404 A | 7/1994 | Moeller et al. |
| 5,351,123 A | 9/1994 | Spahlinger |
| 5,359,413 A | 10/1994 | Chang et al. |
| 5,365,338 A | 11/1994 | Bramson |
| 5,412,471 A | 5/1995 | Tada et al. |
| 5,459,575 A | 10/1995 | Malvern |
| 5,469,257 A | 11/1995 | Blake et al. |
| 5,469,267 A | 11/1995 | Wang |
| 5,471,301 A * | 11/1995 | Kumagai et al. ........... 356/460 |
| 5,493,396 A | 2/1996 | Sewell |
| 5,500,909 A | 3/1996 | Meier |
| 5,504,684 A | 4/1996 | Lau et al. |
| 5,552,887 A | 9/1996 | Dyott |
| 5,559,908 A | 9/1996 | August et al. |
| 5,654,906 A | 8/1997 | Youngquist |
| 5,655,035 A | 8/1997 | Burmenko |
| 5,682,241 A | 10/1997 | Mark et al. |
| 5,701,177 A | 12/1997 | Kumagai et al. |
| 5,701,376 A | 12/1997 | Shirasaki |
| 5,767,509 A | 6/1998 | Cardova et al. |
| 5,781,675 A | 7/1998 | Tseng et al. |
| 5,854,864 A | 12/1998 | Knoesen et al. |
| 5,898,496 A | 4/1999 | Huang et al. |
| 5,946,097 A | 8/1999 | Sanders et al. |
| 5,987,195 A | 11/1999 | Blake |
| 6,023,331 A | 2/2000 | Blake et al. |
| 6,025,915 A | 2/2000 | Michal et al. |
| 6,047,095 A | 4/2000 | Knoesen et al. |
| 6,075,915 A | 6/2000 | Koops et al. |
| 6,148,131 A | 11/2000 | Geertman |
| 6,396,965 B1 | 11/2000 | Anderson |
| 6,163,632 A | 12/2000 | Richman et al. |
| 6,389,185 B1 | 1/2001 | Meise et al. |
| 6,185,033 B1 | 2/2001 | Bosc et al. |
| 6,233,371 B1 | 5/2001 | Kim et al. |
| 6,301,400 B1 | 10/2001 | Sanders |
| 6,351,310 B1 * | 2/2002 | Emge et al. ................. 356/460 |
| 6,370,289 B1 | 4/2002 | Bennett |

OTHER PUBLICATIONS

Dupraz, J.P., "Fiber–Optic Interferometers for Current Measurement: Principles and Technology", Alsthom Review No. 9: 29–44 (Dec. 1987).

Frosio, G. and Dändliker, "Reciprocal Reflection Interfreometer for a Fiber–Optic Faraday Current Sensor", Applied Optics 33 (25): 6111–6122 (Sep. 1, 1994).

Short, S. et al., "Elimination of Birefringence Induced Scale Factor Errors in the In–Line Sagnac Interferometer Current Sensor", Journal of Lightwave Technology 16 (10): 1844–1850 (Oct. 1998).

Alekseev et al; "Fiber Optic Gyroscope With Suppression of Excess Noise From the Radiation Source", Technical Physical Letters, 24(9):719–721, (Sep. 1998).

Blake and Szafraniec, "Random Noise in PM and Depolarized Fiber Gyros", OSA Symposium Proceedings, 1997, OWB2, pp. 122–125.

Bohnert. et al., "Temperature and Vibration Insensitive Fiber–Optic Current Sensor" *ABB*, vol. 2360 pp 336–339 (Feb. 1994).

Burns, et al., "Excess Noise in Fiber Gyroscope Sources", IEEE Photonics Technology Letter, vol. 2, No. 8, Aug. 1990, pp. 606–608.

Clark et al., "Application of a PLL and ALL Noise Reduction Process in Optical Sensing System," *IEEE Translations on Industrial Electronics,* vol. 44, No. 1, Feb. 1997, pp. 136–138.

Dagenais et al., "Low–Frequency Intensity Noise Reduction for Fiber–Optic Sensor Applications," *Optical Fiber Sensors Conference,* 1992, Jan. 29–31, pp. 177–180.

Gronau Yuval et al.; "Digital Signal Processing For An Open–Loop Fiber–Optic Gyroscope", Applied Optics, Optical Society of America, Washington, U.S., vol. 34, No. 25 Sep. 1, 1995, pp. 5849–5853.

Killian M. Kevin; "Pointing Grade Fiber Optic Gyroscope", IEEE AES Systems Magazine, pp. 6–10 (Jul. 1994).

LaViolette and Bossler: "Phase Modulation Control for An Interferometric Fiber Optic Gyroscope", IEEE Plan 90, Position Location and Navigation Symposium, Las Vegas, (Mar. 20–23, 1990).

Lefevre, "The Fiber–Optic Gyroscope", Artech House, Boston, pp. 29–30 (1993).

McCallion and Shimazu; "Side–Polished Fiber Provides Functionality and Transparency", Laser Focus World, 34 (9): S19–S24, (Sep. 1, 1998).

Moeller and Burns, "1.06μm All–fiber Gyroscope with Noise Subtraction, Proceedings of the Conference on Optical Fiber Sensors", IEEE–OSA, Monterey, CA, 1992, pp. 82–85.

Moeller and Burns, "Observation of Thremal Noise in a Dynamically Biased Fiber–Optic Gyro", Optical Letters, 1996, vol. 21, pp. 171–173.

Nikos Drakos, "Circular Polarization States for Light, and Quarter–Wave Plates," *Computer Based Learning Unit, University of Leeds* (Mar. 2, 1998).

Ono et al.; "A Small—Sized, Compact, Open–loop Fibre–Optic Gyroscope with Stabilized Scale Factor", Meas. Sci. Technol. 1: 1078–1084, (1990.

Polynkin et al.; "All-Optical Noise-Substraction Scheme for a Fiber-Optic Gyroscope", Optics Letters, 25(3): 147–149, (Feb. 1, 2000).

Rabelo et al.; "SNR Enhancement of Intensity Noise-limited FOGs", Journal of Lightwave Technology 18(12):2146–2150 (Dec. 2000).

Short, S. et al., "Elimination of Birefringence Induced Scale Factor Errors in the In-Line Sagnac Interferometer Current Sensor", Journal of Lightwave Technology 16 (10): 1844–1850 (Oct. 1998).

* cited by examiner

REDUCED MINIMUM CONFIGURATION FIBER OPTIC CURRENT SENSOR

CROSS REFERENCE TO RELATED APPLICATIONS

This application is a continuation-in-part of U.S. Ser. No. 08/835,307 filed Apr. 7, 1997, now abandoned, which claims benefit of U.S. Ser. No. 60/015,884 filed Apr. 19, 1996. This application also claims benefit of Provisional Application No. 60/143,847, filed Jul. 15, 1999. This application is related to U.S. Ser. No. 09/459,438, now U.S. Pat. No. 6,351,310, which is a continuation of U.S. Ser. No. 08/835,307.

FIELD OF THE INVENTION

The present invention relates to fiber optic sensors. Specifically, the invention relates to fiber optic current sensors and their signal processing electronics.

BACKGROUND OF THE INVENTION

The interferometric Fiber Optic Sensor (FOS) is an established technology for accurately measuring angular rotation (interferometric Fiber Optic Gyroscope, FOG) and magnetic fields (interferometric or polarimetric fiber optic current sensor, FOCS). It will be understood that the FOCS does not directly sense an electric current, but rather the effect of a magnetic field produced by that current. Because the FOS is an optical, solid state design with no moving parts, it can be used for long life, high reliability applications such as vehicle navigation and remote sensing of electric currents.

The fundamental working principle behind the FOS is the Sagnac effect for rotation sensors (FOG) and the Faraday effect for current sensors (FOCS). In the FOG measuring rotation, two counter-propagating light waves traversing a loop interferometer acquire a phase difference when the loop is rotated about its axis. In a FOCS measuring an electric current flowing in a wire that passes through the coil plane, the phase difference is produced by the magnetic field associated with the current. Depending on the configuration of the optical path of the light waves, the FOS may incorporate interferometric or polarimetric phase modulation. Accurate measurement of the phase difference induced by the rotation or current requires the parasitic phase differences, which can vary with the environment, be suppressed. For this reason, the principle of optical reciprocity is used to select portions of the counter-propagating waves which pass through the interferometer or polarimeter along a common path. In the following, "interferometer" is meant to refer to both interferometric or polarimetric devices. Variations induced in the system by the environment change the phase of both waves equally and no difference in phase delay results; the sensor is environmentally stable.

In a conventional interferometric fiber optic gyroscope (FOG), the light emitted from a suitable light source passes through a first 3 dB coupler where half of the light is dissipated, and half is sent into the interferometer through the polarizer. A second 3 dB coupler splits the light into two approximately equal intensity, counter-propagating beams which traverse the coil. The two light beams then recombine at the second coupler where they interfere. This combined light beam then passes through the polarizer a second time in the opposite direction, and half of the light is directed to the detector by the first coupler. The first coupler is not part of the optically reciprocal Sagnac interferometer. Its sole purpose is to direct some of the returning light into a photodetector and to minimize direct coupling of light energy from the source into the detector. An optical splitting ratio of 3 dB is selected for the couplers to maximize the optical power incident on the detector. This leads to an inherent 6 dB of system loss since this coupler is passed twice.

In a conventional interferometric fiber optic current sensor (FOCS), the light beam also passes through a first directional coupler that isolates the optical detector, and then through a polarizer which produces linearly polarized light. The linearly polarized light beam is then split in two by the second directional coupler, with one beam being directed into one end of a sensing coil comprising loops of non-birefringent fiber. The other of the two light beams is directed through a phase modulator into the other end of the sensing coil. Before entering the sensing coil, each of the linearly polarized light beams passes through a respective quarter wave plate and emerges therefrom as circularly polarized light, which is the light entering the sensing coil. Light emerging from the two fiber ends of the sensing coil passes again through the quarter wave plate, producing linearly polarized return light. The return light is recombined by the second directional coupler and the intensity of the recombined light is detected by an optical detector.

Another type of conventional FOCS is based on a reflective current sensing coil which simplifies the design by eliminating the second directional coupler. The orthogonally linearly polarized light beams pass through a quarter wave plate and emerges therefrom as counter-rotating circularly polarized light prior to entering the sensing coil. Upon reflection at the end of the fiber, the sense of rotation of the two light waves are reversed and the light travels back through the sensing region, whereafter the light is converted back to linearly polarized light. The intensity of the recombined light is detected by an optical detector. If a birefringence modulator is used instead of a phase modulator, a 45° splice has to be inserted before the light enters the modulator.

The phase modulator can be, for example, a piezo-electric transducer (PZT). Other methods of modulating the phase difference, for example, electro-optic material such as lithium niobate can be used. If an integrated optics assembly (IOC) is used for modulation, then a Y-junction power splitter may be included instead of the directional coupler connected to the sensing coil. This phase modulation serves two purposes. One is to dynamically bias the interferometer to a more sensitive operating point and also allow the determination of rotation sense. The other is to move the detected signal from direct current (DC) to alternating current (AC) in order to improve the accuracy of the electrical signal processing. With sinusoidal phase modulation in an open-loop signal processing configuration, the interferometer output signal is an infinite series of sine and cosine waveforms whose maximum amplitudes are Bessel functions related to the phase modulation amplitude. The maximum amplitudes of the Bessel functions are proportional to the sine (odd harmonics) and cosine (even harmonics) of the measured quantity. The fundamental signal is located at the applied modulation frequency with subsequent even and odd harmonic signals. Many signal processing approaches have been proposed which use ratios of the fundamental and the three lowest order harmonic signals amplitudes to detect rotation rate and/or magnetic field, while at the same time maintaining a stable, linear output scale factor. However implementation of these approaches in analog and/or digital electronic hardware is complex and expensive. A much simpler signal processing design, which is not affected by an error in the relative amplitude of the sensor harmonic signals is therefore desired.

Scale factor linearity (i.e. measured current or magnetic field versus the applied current or magnetic field) is maintained due to the intrinsic linearity of the Sagnac and Faraday effect for small measured current or magnetic field values. At higher rate or currents, during environment changes (i.e. temperature, vibration, etc.) and over the life time of the sensor, the linearity can be maintained using conventional signal processing techniques.

It would therefore be desirable to provide a fiber optic current sensor with a smaller number of optical components which can be produced more easily and less expensively. It would also be desirable to provide an electronic system for processing the current sensor output signal in order to maintain a constant scale factor during environment changes.

SUMMARY OF THE INVENTION

The present invention is directed to a reduced minimum configuration (RMC) fiberoptic current sensor (FOCS) system for measuring a magnetic field, in particular a magnetic field induced by an electric current. According to one aspect of the invention, the RMC FOCS system includes a fiber sensing coil; a light source having a front output and a back output and emitting light with an associated light source intensity; an optical coupler, which may also include a polarizer, disposed between the front output and the coil and receiving the light from the light source, the coupler creating two linearly polarized light beams of substantially equal intensity; a first quarter wave plate disposed proximate to a first end of the fiber sensing coil and receiving a first of the two linearly polarized light beams and converting the first linearly polarized light beam into first circularly polarized light propagate through the sensing coil in a first direction; a second quarter wave plate disposed proximate to a second end of the fiber sensing coil and receiving a second of the two linearly polarized light beams and converting the second linearly polarized light beam into second circularly polarized light propagate through the sensing coil in a second direction opposite the first direction, the first and second circularly polarized light passing though the sensing coil experiencing a differential phase shift caused by a magnetic field or current flowing in a conductor proximate to the sensing coil; the fiber sensing coil supplying phase-shifted circularly polarized return light to the first and second quarter wave plates, the first and second quarter wave plates converting the phase-shifted circularly polarized return light back to linearly polarized return light, the coupler combining and interfering the linearly polarized return light into a combined light beam; and a light detector operatively coupled to the back output of the light source, the light detector detecting and providing an output signal in response to the combined light beam transmitted through the light source.

According to another aspect of the invention, the reduced minimum configuration (RMC) fiber optic current sensor (FOCS) system includes a fiber optic sensing region with an optical fiber; a light source having a front output and a back output and emitting light with an associated light source intensity; and an optical path operatively connecting the front output of the light source with the fiber optic sensing region for transmitting two linearly polarized light beams from the light source along the optical path. At least one quarter wave plate is disposed between the optical path and the sensing region for converting the two linearly polarized light beams into two opposing circularly polarized light beams propagating through the sensing region, with the two opposing circularly polarized light beams which propagate though the sensing region experiencing a differential phase shift caused by a magnetic field or current flowing in a conductor proximate to the sensing coil. The fiber sensing region may include a reflector located at an end portion of the fiber sensing region that reflects the circularly polarized light beams, supplying phase-shifted circularly polarized return light to the at least one quarter wave plate which converts the phase-shifted circularly polarized return light back to interfering linearly polarized return light beams. A light detector which is operatively coupled to the back output of the light source detects the interfered return light beams transmitted through the light source and provides an output signal in response to the interfered return light beams transmitted through the light source.

Embodiments of the RMC FOCS system may include one or more of the following features. The RMC FOCS may include a polarizer disposed between the front output and the sensor coil, with the polarizer polarizing the light emitted from the light source and the return light beam. In a reflective RMC FOCS, a 45° twist may be inserted between the polarizer and the sensor coil. An optical phase or birefringence modulator may be coupled to the sensor coil; an oscillator, which controls the modulation amplitude, may be coupled to the modulator. An electrical amplifier which receives the output signal may be coupled to the detector, with a direct current block, a rectifier, an integrating comparator, and light source drive means coupled to the amplifier, for controlling the associated light source intensity. Electrical signal processing means may also be coupled to the amplifier for processing the output signal and providing an output value correlated with the magnetic field or current.

DETAILED DESCRIPTION OF CERTAIN ILLUSTRATED EMBODIMENTS

Figure 1:
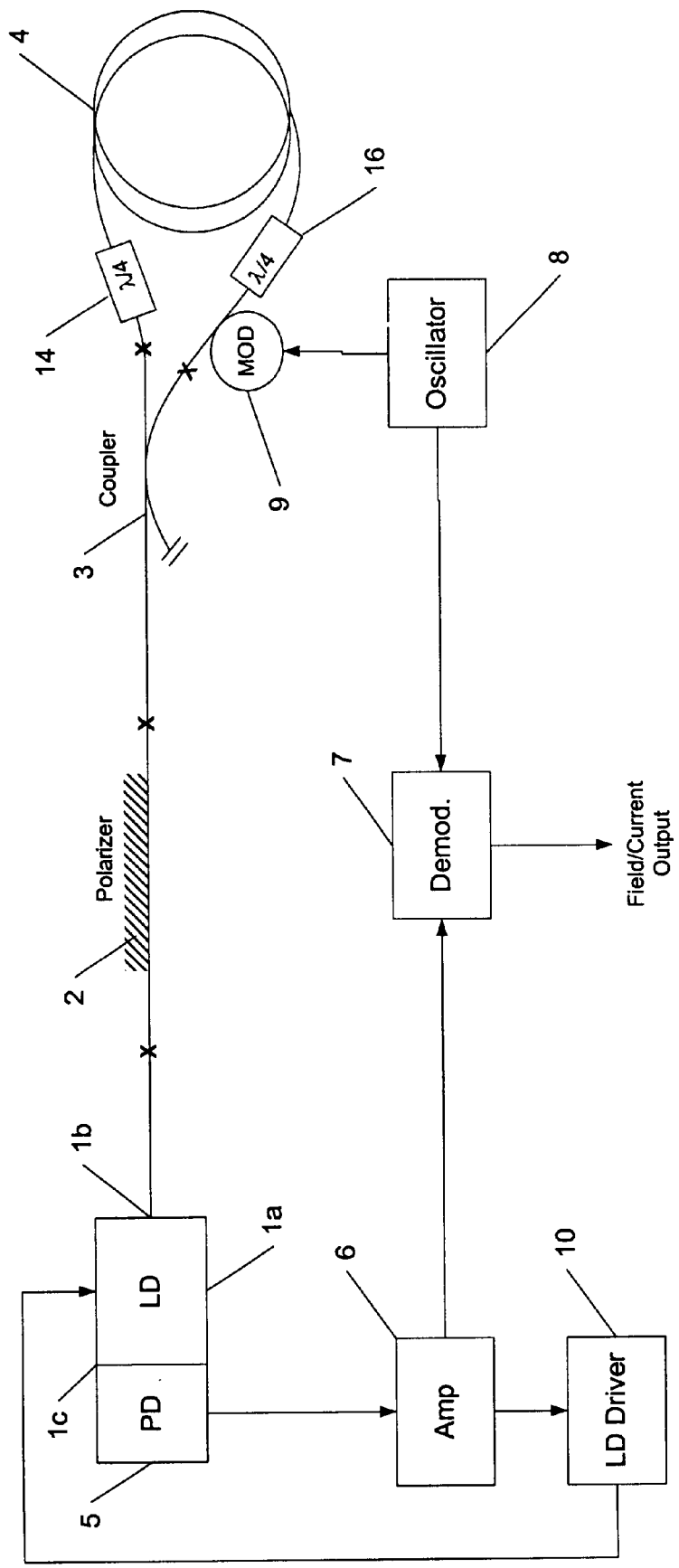
FIG. 1 is a schematic diagram of a first embodiment of a RMC FOCS system according to the invention.

While the invention is susceptible to various modifications and alternative forms, specific embodiments thereof are shown by way of example in the drawings and will herein be described in detail. It should be understood, however, that this is not intended to limit the invention to the particular forms disclosed, but on the contrary, the intention is to cover all modifications, equivalents, and alternatives failing within the spirit and scope of the invention as defined below.

The invention is directed to a "Reduced Minimum Configuration" (RMC) fiber-optic current sensor (FOCS). Unlike conventional FOCS, the first coupler is omitted and the interferometer output is read out by a detector positioned at a back facet output of the light source. Referring first to FIG. 1, a light source 1a emits light from a front output facet 1b which is polarized by polarizer 2. Several types of light sources can be used, including a laser diode (LD), a superluminescent diode (SLD), and light emitting diode (LED), or a superradiant fiber amplifier. The polarizer 2 can be, for example, a fiber polarizer, a lithium niobate polarizer or a polymer waveguide polarizer. Coupler 3 splits the light into two counter-propagating beams of an approximately equal intensity. Quarter wave plates 14, 16 are inserted in the optical path at both ends of the sensing coil. The quarter wave plates 14, 16 convert the linearly polarized light produced by polarizer 2 into circularly polarized light which counter-propagates in the sensing coil 4. A magnetic field introduces a phase shift (Faraday rotation) of the counter-propagating circularly polarized light beams, wherein the direction of the phase shift depends on the propagation direction of the circularly polarized light beams with respect to the direction of the magnetic field. The quarter wave plates 14, 16 convert the respective returned circularly polarized light beams, which have passed through the sensing coil, back into linearly polarized light beams which are then recombined in the coupler 3. The coupler can be a directional coupler formed from optical fiber or integrated optics components.

The recombined light beam then passes through the source 1a and is received at a back facet output 1c of the light source 1a by a detector 5. The detector 5 can be a photodetector coupled to an amplifier 6, for example a transimpedance amplifier, which converts the optical input to an output voltage. The output of detector 5 is passed through a suitable amplifier 6 providing a voltage gain of, for example, one million. The amplifier output is applied to demodulator 7. Demodulator 7 can be a phase sensitive detector (PSD) which receives a signal from oscillator 8. For an FOCS, the output of the demodulator 7 is a function of the magnetic flux through the sensing coil 4 and is sinusoidal and can be approximated by a linear function for low to moderate magnetic fields or currents. If the phase and frequencies of the two signals entering demodulator 7 are the same, the output is at a maximum, if they are different, the output is reduced. The oscillator 8 and the phase modulator 9, as will be explained in greater detail below, maintain the interferometer depth of the phase modulation. Alternatively, other phase modulators can be used such as those constructed from lithium niobate or another electro-optic material. Light source controller/driver 10, which regulates the intensity of the light source, may include additional elements, such as a filter, a rectifier and an integrating comparator, as will be explained in greater detail below.

Figure 2:
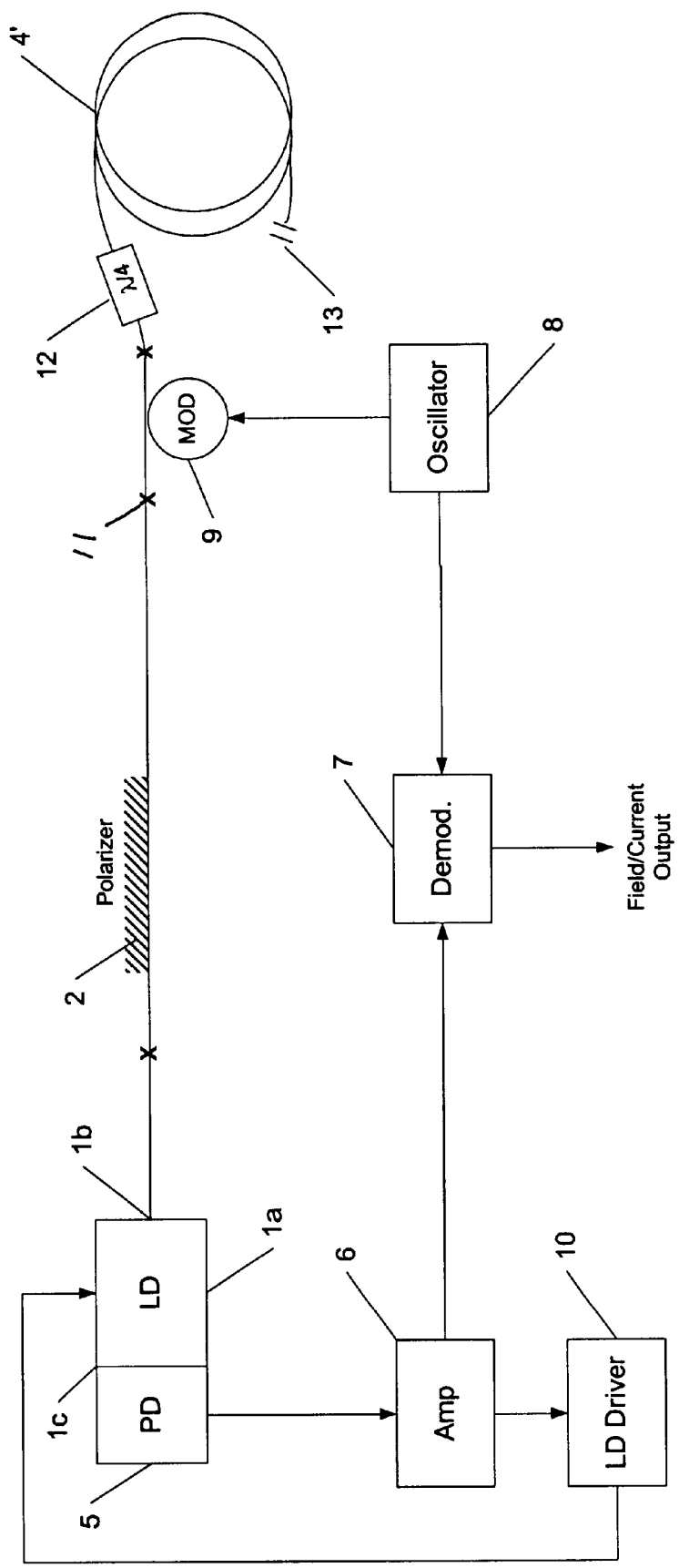
FIG. 2 is a schematic diagram of a second embodiment of a RMC FOCS system according to the invention.

Referring now to FIG. 2, depicting another embodiment of a RMC FOCS system according to the present invention, the light source 1a emits light from a front output facet 1b which is polarized by polarizer 2. A birefringent modulator 9 modulates the polarization direction of the polarized light. A 45° splice 11 is inserted between the polarizer 2 and the birefringent modulator 9 to provide orthogonally linearly polarized light. A single quarter wave plates 12 disposed between the one end of the sensing coil 4' and the phase modulator 9 converts the modulated linearly polarized light into two opposing circularly polarized light beams propagating through the sensing region. Unlike the first embodiment, the light is introduced only at one end of the sensing coil 4'. The other end of the sensing coil 4' has a reflector 13 which reflects the circularly polarized light back into the sensing coil 4' while reversing the polarization direction. The reflective sensor coil geometry has the added advantage of being less sensitive to mechanical vibrations and sensor coil rotation.

The sensing coil's scale factor can be designed so that this maximum current range is well within an essentially linear region of the sensor's output transfer function. Alternatively, electronic linearization techniques known in the art can also be used. The fiber coil length of the sensing coil depends on the current range to be measured and can be between 1 m to 1,000 m, preferably between 1 m and 20 m. The coil is wound in such a way that a conductor can pass through the coil opening. The separation between the first directional coupler and the sensing coil and the λ/4 wave plate, respectively, can be between 20 m and 1,000 m, so that polarization-maintaining fiber is employed between the first directional coupler and the sensing coil or λ/4 wave plate. With this type of construction, the current can be directly determined from the amplitude of the fundamental signal (F1). Since the phase and frequency of the fundamental signal are known, an effective way to determine the amplitude is by synchronous demodulation.

Figure 3:
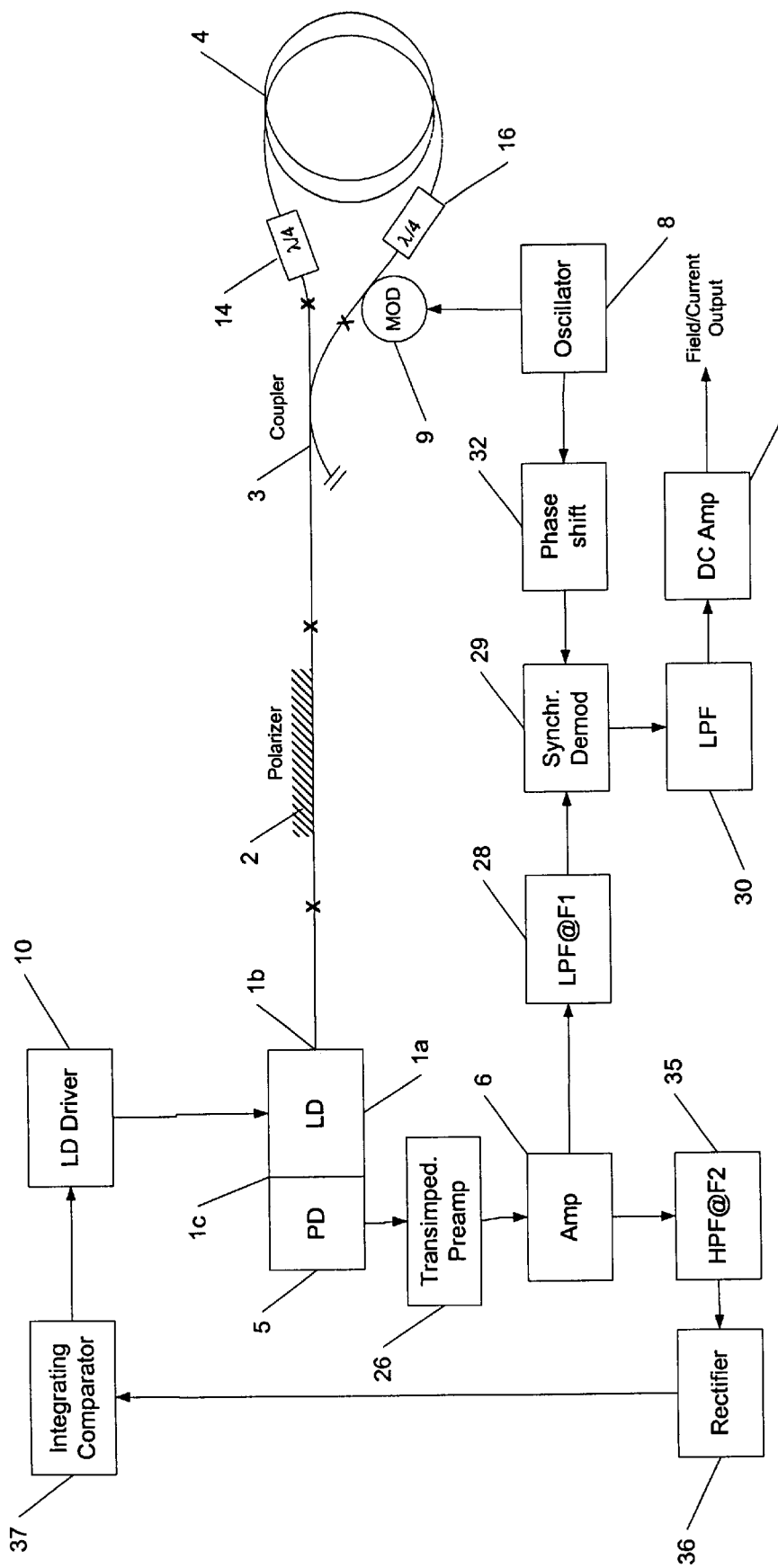
FIG. 3 is a detailed diagram of an electronic control circuit of the first embodiment of the a RMC FOCS system of FIG. 1.

Referring now to FIG. 3, the broadband signal current detected by detector 5 is passed through a transimpedance pre-amplifier 26 which converts the detected photo current to a voltage and through amplifier 27 which provides voltage signal gain. The amplified voltage signal is then applied to a low pass filter (LPF) 28 whose corner frequency is at the fundamental frequency (F1) prior to being synchronously demodulated in a synchronous demodulator 29. The low pass filter 28 attenuates all harmonics from the voltage signal leaving only the fundamental frequency (F1). The other input of the synchronous demodulator 29 receives a voltage signal from a self-resonant oscillator and amplifier circuit 8, which, as discussed below, may use a Colpitts oscillator and an AGC amplifier to provide a stable amplitude and self-resonant frequency to the modulator 9. However, as is known in the art, the circuit 8 can be a crystal oscillator providing a fixed amplitude, a digital synthesizer, fixed frequency signal or can be a Colpitts oscillator (only) providing a self-resonant signal of fixed amplitude to the modulator.

The output of circuit 8 is passed through a phase shifter and low pass filter 32 whose corner frequency is equal to or higher than the fundamental frequency (F1). The output of demodulator 29 is at a maximum when the phases and frequencies of its input signals are equal, and is proportional to the magnitude of the sensor output signal at the fundamental frequency (F1) which is a function of the magnetic field or current. This output may be passed through another low pass filter 30 which produces a DC signal proportional to the magnetic field or current. Finally, the DC signal is amplified in DC amplifier 31 to set the desired sensor scale factor. The demodulation produces a linear output over a wide dynamic magnetic field and/or current range. Resolution of the magnetic field measurement is determined by the noise figure of the transimpedance pre-amplifier 26 and the bandwidth of the measurement.

Those skilled in the art will recognize that the output of a current sensor that measures an AC magnetic field produced, for example, by the AC current flowing through an AC power line, instead of the DC magnetic field described above will produce a corresponding AC signal including the fundamental frequency of the AC power line as well as harmonics thereof.

Maintaining a constant scale factor during environmental changes requires that two sensor operating points be accurately maintained. First, the magnitude of the sensor signal at the output of the amplifier 6 must be constant. To accomplish this, one aspect of the invention takes advantage of the fact that for short coil length sensors, the amplitude of the second harmonic signal (F2) is relatively constant over the entire rate/magnetic field range. Thus, the broadband sensor signal is high pass filtered (HPF) at the second harmonic frequency (F2) by a high pass filter 35, rectified by rectifier 36, integrated and compared with a reference by integrating comparator 37, and applied to the light source 21 by source driver 10. The resulting DC signal is used to control the optical power output of source 1a by increasing or decreasing the light source current and therefore the emitted optical power. High pass filter 35 may be required to reduce the influence of the fundamental signal (F1) on the light source control circuit accuracy at high magnetic fields or currents. As is known in the art, the high-pass filter 35 may be replaced with a DC-block or a band pass filter and the rectifier 36 may be a full-wave-rectifier or a half-wave rectifier.

The second sensor operating point which should be maintained, is the interferometer depth of phase modulation controlled at PZT phase modulator 9. The depth of phase modulation is set by the amplitude of the sine wave drive voltage applied to the PZT phase modulator 9. However, maintaining a sine wave drive having merely a fixed frequency and amplitude will not guarantee a fixed depth of phase modulation. Over time and with changes in temperature, the resonant frequency (Fr) of the PZT modulator 9 may drift. Also, the mechanical-to-optical phase shift conversion scale factor ($Q_m$) of the PZT modulator 9 may change. As discussed above, the invention uses the phase modulator 9 as an active part of the oscillator circuit by applying the output of the self-resonant oscillator and adjustable gain controlled (AGC) amplifier circuit 8 to the phase shifter and low pass filter 32. Because the modulator 9 is part of the active feedback circuit, any movement in the resonant modulator frequency is tracked. Changes in Qm and Fr also change the dynamic impedance of the modulator affecting the drive amplitude. The self-resonant oscillator and AGC amplifier circuit 8 is used to maintain a stable sine wave drive amplitude through changes in the environment, although other self-resonant oscillators known in the art could also be used.

Thus, a FOCS system with simplified signal processing electronics is provided where the fundamental sensor signal amplitude is synchronously demodulated to determine the magnetic field or the current. The second harmonic sensor signal (F2) is used to control the light source intensity. Taking the ratio of these signals is not required. The depth of phase modulation is maintained by using a self-resonant oscillator approach with the phase modulator as part of the active electrical circuit.

This configuration eliminates non-essential optical components and splices from the system, allowing for the construction of a lower cost FOCS system. Using the RMC FOCS with this simplified signal processing electronics approach produces a very attractive cost-effective magnetic field sensor which can be used to measure electric currents. The FOCS signal processing system is simple and can be produced at low cost, accurately determines the external quantities affecting the sensor coil, and maintains a constant scale factor during changes in the environmental conditions.

Figure 4:
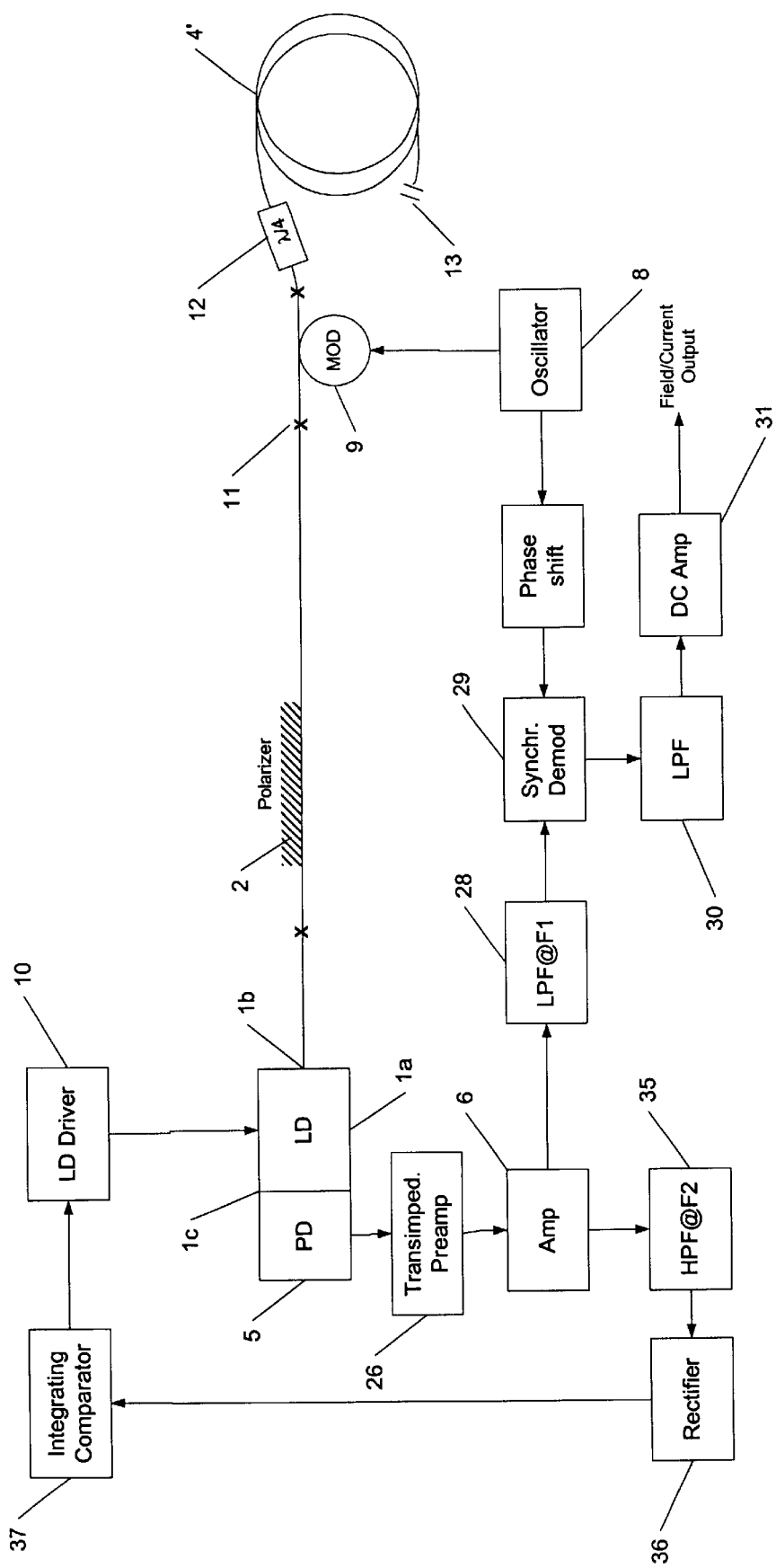
FIG. 4 is a detailed diagram of an electronic control circuit of the second embodiment of the RMC FOCS system of FIG. 2.

Referring now to FIG. 4, the same signal processing electronics described above with reference to FIG. 3 can be used with the reflective fiber-optic current sensor of FIG. 2. Using the RMC FOCS with this simplified signal processing electronics approach produces a very attractive cost-to-performance magnetic field and current sensor which is rather insensitive to mechanical vibrations and coil rotation.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A reduced minimum configuration (RMC) fiber optic current sensor (FOCS) system comprising:

a fiber sensing coil;

a light source having a front output and a back output and emitting light with an associated light source intensity;

an optical coupler disposed between the front output and the coil and receiving the light from the light source, the coupler creating two linearly polarized light beams of substantially equal intensity;

a first quarter wave plate disposed proximate to a first end of the fiber sensing coil and receiving a first of the two linearly polarized light beams and converting the first linearly polarized light beam into first circularly polarized light propagate through the sensing coil in a first direction;

a second quarter wave plate disposed proximate to a second end of the fiber sensing coil and receiving a second of the two linearly polarized light beams and converting the second linearly polarized light beam into second circularly polarized light propagate through the sensing coil in a second direction opposite the first direction, the first and second circularly polarized light passing though the sensing coil experiencing a differential phase shift caused by a magnetic field or a current flowing in a conductor proximate to the sensing coil;

the fiber sensing coil supplying phase-shifted circularly polarized return light to the first and second quarter wave plates, the first and second quarter wave plates converting the phase-shifted circularly polarized return light back to linearly polarized return light, the coupler combining and interfering the linearly polarized return light into a combined light beam;

a light detector operatively coupled to the back output of the light source, the light detector detecting and providing an output signal in response to the combined light beam transmitted through the light source;

an optical modulator having a modulation depth, the modulator coupled to the coil;

an oscillator coupled to the modulator and controlling the phase modulation amplitude;

an electrical amplifier coupled to the detector and receiving the output signal;

light source drive means coupled to the amplifier, which control the associated light source intensity; and electrical signal processing means coupled to the amplifier for processing the amplified output signal and providing an output value corresponding to the magnetic field or current, wherein the light source drive means include a direct current block, a rectifier, and an integrating comparator.

2. The RMC FOCS system of claim 1, further comprising:

a polarizer coupled between the front output and the optical coupler, the polarizer polarizing the light emitted from the light source and the return light beam.

3. The RMC FOCS system of claim 1, wherein the light source is selected from the group including a semiconductor light source and rare-earth doped fiber light source.

4. The RMC FOCS system of claim 1, wherein the direct current block comprises a high pass filter.

5. The RMC FOCS system of claim 1, wherein the rectifier is a half-wave rectifier.

6. The RMC FOCS system of claim 1, wherein the oscillator is a piezo-electric transducer phase modulator drive supplying a fixed amplitude and fixed frequency periodic waveform.

7. The RMC FOCS system of claim 1, wherein the oscillator is a piezo-electric transducer phase modulator drive supplying a fixed amplitude and self-resonant frequency waveform.

8. The RMC FOCS system of claim 1, wherein the oscillator is a piezo-electric transducer phase modulator drive supplying an adjustable gain-controlled, self resonant frequency waveform.

9. The RMC FOCS system of claim 1, wherein the rectifier is a full-wave rectifier.

10. The RMC FOCS system of claim 1, wherein the direct current block comprises a band pass filter.

11. A reduced minimum configuration (RMC) fiber optic current sensor (FOCS) system comprising:

a fiber optic sensing region comprising an optical fiber;

a light source having a front output and a back output and emitting light with an associated light source intensity;

an optical path operatively connecting the front output of the light source with the fiber optic sensing region for transmitting two linearly polarized light beams from the light source along the optical path;

at least one quarter wave plate disposed between the optical path and the sensing region for converting the two linearly polarized light beams into two opposing circularly polarized light beams propagating through the sensing region;

the two opposing circularly polarized light beams propagating though the sensing region experiencing a differential phase shift caused by a magnetic field or current flowing in a conductor proximate to the sensing coil;

the fiber sensing region supplying phase-shifted circularly polarized return light to the at least one quarter wave plate, the at least one quarter wave plate converting the phase-shifted circularly polarized return light back to interfering linearly polarized return light beams;

a light detector operatively coupled to the back output of the light source, the light detector detecting and providing an output signal in response to the interfering return light beams transmitted through the light source;

an optical modulator providing a modulation depth, the modulator coupled to the fiber optic sensing region;

an oscillator coupled to the modulator and controlling the phase modulation amplitude;

an electrical amplifier coupled to the detector and receiving the output signal;

light source drive means coupled to the amplifier and controlling the associated light source intensity; and electrical signal processing means coupled to the amplifier for processing the output signal and providing an output value correlated with the magnetic field or current, wherein the light source drive means include a direct current block, a rectifier and an integrating comparator.

12. The RMC FOCS system of claim 11, further comprising:

a polarizer coupled between the front output and the fiber optic sensing region, the polarizer polarizing the light emitted from the light source and the return light beam.

13. The RMC FOCS system of claim 11, wherein the light source is selected from the group including a semiconductor light source and rare-earth doped fiber light source.

14. The RMC FOCS system of claim 11, wherein the oscillator is a piezo-electric transducer phase modulator drive supplying a fixed amplitude and fixed frequency periodic waveform.

15. The RMC FOCS system of claim 11, wherein the oscillator is a piezo-electric transducer phase modulator drive supplying a fixed amplitude and self-resonant frequency waveform.

16. The RMC FOCS system of claim 11, wherein the oscillator is a piezo-electric transducer phase modulator drive supplying an adjustable gain-controlled, self-resonant frequency waveform.

* * * * *